(12) United States Patent
Chang

(10) Patent No.: US 6,586,844 B1
(45) Date of Patent: Jul. 1, 2003

(54) FLIP CHIP DIE

(75) Inventor: Wen-Yuan Chang, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/115,735

(22) Filed: Apr. 3, 2002

(30) Foreign Application Priority Data

Jan. 29, 2002 (TW) ........................................ 91101433 A

(51) Int. Cl.$^7$ ................................................ H01L 29/40
(52) U.S. Cl. ........................ 257/779; 257/778; 257/780; 257/738
(58) Field of Search ................................ 257/738, 772, 257/773, 778, 779, 780, 786; 438/108, 612, 618, 666

(56) References Cited

U.S. PATENT DOCUMENTS

| 5,977,632 A | * | 11/1999 | Beddingfield | ............... 257/737 |
| 6,118,180 A | * | 9/2000 | Loo et al. | .................. 257/778 |
| 6,326,699 B2 | * | 12/2001 | Shimizu et al. | ............. 257/786 |
| 6,348,401 B1 | * | 2/2002 | Chen et al. | .................. 438/617 |
| 6,415,974 B2 | * | 7/2002 | Jao | ............................. 257/779 |
| 6,426,562 B2 | * | 7/2002 | Farnworth | .................... 257/779 |
| 6,433,427 B1 | * | 8/2002 | Wu et al. | ..................... 257/778 |

* cited by examiner

*Primary Examiner*—Steven Loke
*Assistant Examiner*—Quang Vu
(74) *Attorney, Agent, or Firm*—J.C. Patents

(57) ABSTRACT

A flip chip die, having a chip with an active surface, a passivation layer, at least one first bump pad and at least one second bump pad. The passivation layer, the first and second bump pads are formed on the active surface, where the first and second bump pads are exposed. The flip chip further has at least one first under ball metallurgy and one second under ball metallurgy formed on the first and the second bump pads, respectively. The contact area between the second under ball metallurgy and the second bump pad is larger than that between the first under ball metallurgy and the first bump pad. In addition, the flip chip has at least one first bump and at least one second bump formed on the first and second under ball metallurgies, respectively.

5 Claims, 1 Drawing Sheet

FLIP CHIP DIE

CROSS-REFERENCE TO RELATED APPLICATION

This application claims the priority benefit of Taiwan application serial no. 91101433, filed Jan. 29, 2002.

SCENARIO OF THE INVENTION

1. Field of the Invention

The present invention relates in general to a flip chip die, and more particularly, to a flip chip die with different contact area for different bonding pad and under ball metallurgy pairs.

2. Description of the Related Art

In the current information explosion, electronic products are broadly applied in daily life. Products assembled by integrated circuit devices are seen in all kinds of activities. As electronic techniques are continuously improved, the functions thereof get more and more complicated, and products get updated all the time. Electronic products strive to be light, thin, short and small, consequently, high-density semiconductor package techniques such as flip chip (F/C) and ball grid array (BGA) have been developed The flip chip technique directly mounts a flipped die on a substrate or a printed circuit board (PCB) via bumps formed on a pad on the die. Compared to the wire bonding and tape automatic bonding (TAB) package techniques, the flip chip package provides shorter signal transmission path, so that better electric characteristics are obtained. In addition, the flip chip technique can also design a bare chip back to enhance heat dissipation during operation. Because of the above features, the flip chip package technique has been widely applied in the semiconductor package industry.

Referring to FIG. 1, a cross sectional view of a conventional flip chip die is shown. The flip chip die 100 comprises a die 102 and multiple bumps 114 (only two of them are illustrated). A passivation layer 106 and multiple bump pads 110 (similarly, only two of them are shown) are formed on an active surface 104 of the die 102. Openings 108 in the passivation layer 106 expose the bump pads 110. In addition, to improve the adhesion between the bumps 114 and the bump pads 110, under ball metallurgies (UBM) 112 are formed on the bump pads 110 as a joint medium between the bumps 114 and the bump pads 110. The flip chip die 100 is then mounted to external substrate or printed circuit board via the bumps 114.

Further referring to FIG. 1, according to specific functionalities, the bump pads 110 can be assorted into signal pads and power/ground pads, while the bumps 114 can be assorted into signal bumps and power/ground bumps. The contact area for each of the bump pad 110 and the under ball metallurgy 112 pair is identical. Therefore, the current flowing from each bump pad 110 to each under ball metallurgy 112 is the same. To obtain the required amount of power/ground current of the die 102, the number of the bump pads 110, especially the power/ground bump pads, has to be increased.

SUMMARY OF THE INVENTION

The invention provides a flip chip die that allows a larger current flowing from the bump pads to the under ball metallurgies, so that the number of power/ground bump pads of the die can be reduced. A better electric performance of the die results.

The flip chip die comprises a die, which further includes an active surface, a passivation layer, at least one first bump pad and at least one second bump pad. The passivation layer, the first and second bump pads are formed on the active surface. The passivation layer exposes the first and the second bump pads. The flip chip die further comprises at least one first under ball metallurgy formed on the first bump pad, and at least one second under ball metallurgy formed on the second bump pad. The contact area between the second under ball metallurgy and the second bump pad is larger than that between the first under ball metallurgy and the first bump pad. At least one first bump and one second bump are formed on the first and the second under ball metallurgies, respectively.

Both the foregoing general description and the following detailed description are exemplary and explanatory only and are not restrictive of the invention, as claimed.

OF THE PREFERRED EMBODIMENTS

Figure 1:
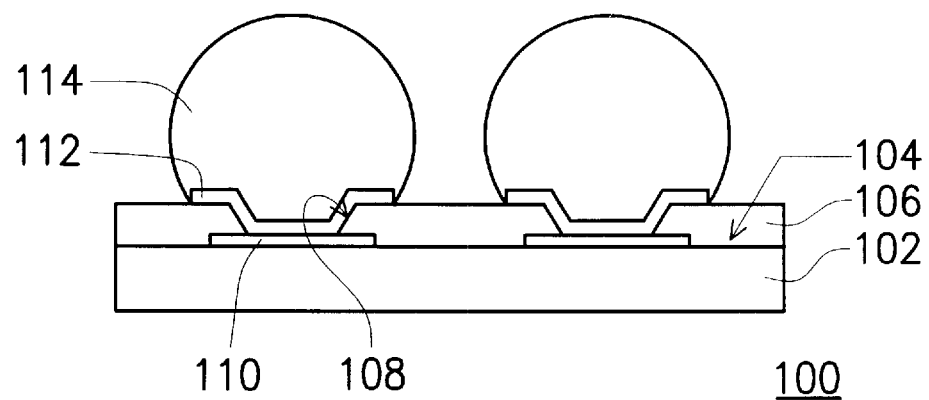
FIG. 1 shows a cross sectional view of a conventional flip chip die.
Figure 2:
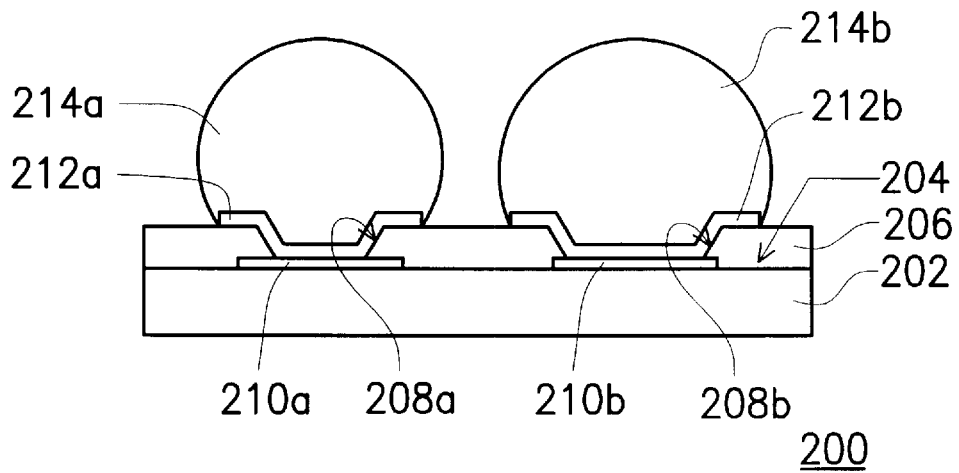
FIG. 2 shows a cross sectional view of a flip chip die according to a preferred embodiment of the invention.

Referring to FIG. 2, a cross sectional view of a flip chip die in one embodiment of the invention is shown. The flip chip die 200 comprises a die 202, a plurality of first bumps 214a (where FIG. 2 only shows an exemplary one thereof), and a plurality of second bumps 214b (where FIG. 2 only shows an exemplary one thereof). The die 202 comprises an active surface 204 on which active devices are formed. A passivation layer 206, a first bump pad 210a and a second bump pad 210b are formed on the active surface 204 of the die 202. The first and second bump pads 210a and 210b include pads originally formed on the die 202, or pads formed by a redistribution layer (not shown).

Further referring to FIG. 2, the passivation layer 206 has at least a first opening 208a and a second opening 208b to expose the first and second bump pads 210a and 210b, respectively. The second opening 208b has a diameter slightly larger than that of the first opening 208a, such that the exposed area of the second bump pad 210b is larger than that of the first bump pad 210a.

To improve the adhesion between the first bump 214a and the first bump pad 210a and between the second bump 214b and the second bump pad 210b, the flip chip die 200 comprises at least one first under ball metallurgy 212a and at least one second under ball metallurgy 212b, respectively. The first under ball metallurgy 212a is formed on the first bump pad 210a, while the second under ball metallurgy 212b is formed on the second bump pad 210b. The first under ball metallurgy 212a has to cover the whole area of the exposed first bump pad 210a and overlap onto the passivation layer 306. In addition, in the bump fabrication process, the height of the first (second) bump 214a (214b) can be controlled by adjusting the area of the first (second) under ball metallurgy 212a (212b)or volume of solder. As the second bump pad 210b has an exposed area larger than that of the first bump pad 210a, the contact area between the second under ball metallurgy 212b and the second bump pad 210b is larger than that between the first under ball metallurgy 212a and the first bump pad 210a.

When the first bump pad 210a is assigned as the signal pad and the second bump pad 210b is assigned as the power/ground pad, the larger contact area between the second bump pad 210b and the second under ball metallurgy 212b allows a larger current through compared to the one through the first bump pad 210a and the first under ball metallurgy 212a. In addition, as the size of the second under ball metallurgy 212b is increased, the volume of the second bump 214b is also increased. Under the circumstance that the first and second bumps 214a and 214b have the same height, the cross section for the current through the second bump 214b is increased, while the resistance thereof is decreased. Therefore, the electric performance of the die 202 is enhanced.

According to the above, the larger contact area between the second bump pad 210b and the second under ball metallurgy 212b allows a larger current from the second bump pad 210b to the second under ball metallurgy 212b. Compared to the conventional die 102, the required current can be obtained by the enlarged contact area between the power/ground pad and the under ball metallurgy without increasing the number of the bumps. Or only a small amount of extra bumps is required to achieve the same objective.

Figure 3:
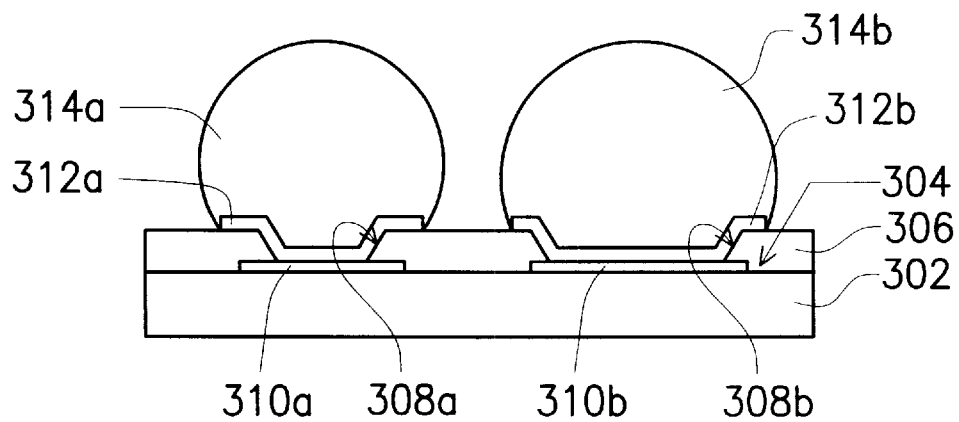
FIG. 3 shows a cross sectional view of another flip chip die in another embodiment of the invention.

To further increase the contact area between the second under ball metallurgy 212b and the second bump pad 210b as shown in FIG. 2, FIG. 3 shows another embodiment to achieve the objective. In FIG. 3, the area of the second bump pad 310b of the flip chip die 300 is larger than the area of the second bump pad 210b of the flip chip die 200. As shown as the flip chip die 300 in FIG. 3, the area of the second bump pad 310b can be further increased, and consequently, the diameter of the second opening 308b is increased to increase the exposed area of the second bump pad 310b. By forming a second under ball metallurgy 312b with a larger area, the contact area between the second bump pad 310b and the second under ball metallurgy 312b is further increased.

According to the above, the design of having different contact area for different bump pad and under ball metallurgy pairs in the invention is achieved by controlling diameter of the opening that exposes the bump pad and increasing the coverage of the under ball metallurgy. Thereby, a larger current can flow through the bonding pad to the under ball metallurgy. Further, the contact area can also be increased by increasing the area of the bump pad; and consequently increasing the diameter of the opening, and increasing the coverage of the under ball metallurgy.

As the flip chip die provided by the invention has different contact area for different bump pad and under ball metallurgy pairs, a larger range of current can flow from the bump pad to the under ball metallurgy. The resistance for the current is decreased, and the operation performance is enhanced. In addition, under the condition that the coverage of the under ball metallurgy is also increased, the volume of the corresponding bump is also increased to increase the cross section of the current flow. The electric performance is enhanced. Further, to obtain the required current for power/ground of the die, a large amount of additional power/ground bumps is not required.

Other embodiments of the invention will appear to those skilled in the art from consideration of the specification and practice of the invention disclosed herein. It is intended that the specification and examples are to be considered as exemplary only, with a true scope and spirit of the invention being indicated by the following claims.

What is claimed is:

1. A flip chip die, comprising:
   a die, having an active surface, on which a passivation layer, at least one first bump pad and at least one second bump pad are formed, where the first and second bump pads are exposed;
   at least one first under ball metallurgy formed on the first bump pad;
   at least one second under ball metallurgy formed on the second bump pad, wherein a contact area between the second bump pad and the second under ball metallurgy is larger than that between the first bump pad and the first under ball metallurgy;
   at least one first bump formed on the first under ball metallurgy, wherein the first bump is a signal bump; and
   at least one second bump formed on the second under ball metallurgy, wherein the second bump is a non-signal bump.

2. The flip chip die according to claim 1, wherein the second bump has the same level of height with the first bump.

3. The flip chip die according to claim 1, wherein an exposed area of the second bump pad is larger than that of the first bump pad.

4. The flip chip die according to claim 1, wherein a coverage of the second under ball metallurgy is larger than a coverage of the first under ball metallurgy.

5. The flip chip die according to claim 1, wherein the second bump pad has an area larger than that of the first bump pad.

* * * * *